(12) United States Patent
Hirakata et al.

(10) Patent No.: US 10,998,808 B2
(45) Date of Patent: May 4, 2021

(54) POWER CONVERSION DEVICE

(71) Applicant: FUJI ELECTRIC CO., LTD., Kanagawa (JP)

(72) Inventors: Masaki Hirakata, Tokyo (JP); Akihiro Odaka, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 59 days.

(21) Appl. No.: 16/042,025

(22) Filed: Jul. 23, 2018

(65) Prior Publication Data
US 2018/0331616 A1 Nov. 15, 2018

Related U.S. Application Data

(63) Continuation of application No. PCT/JP2017/028705, filed on Aug. 8, 2017.

(30) Foreign Application Priority Data

Aug. 9, 2016 (JP) .............................. JP2016-156118

(51) Int. Cl.
*H02M 1/08* (2006.01)
*H02M 7/48* (2007.01)
(Continued)

(52) U.S. Cl.
CPC ............... *H02M 1/08* (2013.01); *H02M 1/32* (2013.01); *H02M 7/48* (2013.01); *H02M 7/5387* (2013.01);
(Continued)

(58) Field of Classification Search
CPC ............ H02M 1/00; H02M 1/08; H02M 1/32; H02M 2001/00; H02M 2001/0006;
(Continued)

(56) References Cited

U.S. PATENT DOCUMENTS 6,239,566 B1  5/2001 Tareilus et al.
8,970,155 B2  3/2015 Funaba et al.
(Continued)

FOREIGN PATENT DOCUMENTS

CN  103380567  10/2013
CN  104578719  4/2015
(Continued)

OTHER PUBLICATIONS

Office Action dated Dec. 23, 2019 issued with respect to the Corresponding Chinese Patent Application No. 201780008686.0.

*Primary Examiner* — Lincoln D Donovan
*Assistant Examiner* — Dave Mattison
(74) *Attorney, Agent, or Firm* — IPUSA, PLLC

(57) ABSTRACT

A power conversion device, that includes a drive circuit 11a that drives a switching element 4 included in an upper-arm for one of three phases, a drive circuit 11b that drives a switching element 5 included in a lower-arm for the one phase, and a control circuit 9 that transmits a control signal to the drive circuits 11a, 11b, is provided. The power conversion device includes power supply circuits 12a, 12b that provide power to the drive circuits 11a, 11b, respectively, a low-voltage power supply 6 that supplies power to one of the power supply circuits, 12a, and a high-voltage power supply 1 that supplies power to the other of the power supply circuits, 12b. Accordingly, it is possible to reliably protect a system: by realizing minimal redundancy of the power supply, the power supply generation circuit, etc.; and by realizing the short-circuit mode at the time of error occurrence.

12 Claims, 11 Drawing Sheets

(51) Int. Cl.
*H02M 1/32* (2007.01)
*H02M 7/5387* (2007.01)
*H03K 17/567* (2006.01)
*H03K 17/687* (2006.01)
*H02M 1/00* (2006.01)

(52) U.S. Cl.
CPC ......... *H03K 17/567* (2013.01); *H03K 17/687* (2013.01); *H02M 2001/0006* (2013.01); *H02M 2001/0009* (2013.01); *H02M 2001/325* (2013.01); *H03K 2217/0081* (2013.01)

(58) Field of Classification Search
CPC ... H02M 2001/0009; H02M 2001/325; H02M 7/00; H02M 7/48; H02M 7/5387; H03K 17/567; H03K 17/687; H03K 19/00; H03K 19/00315; H03K 19/00361; H03K 19/00384; H03K 2217/00; H03K 2217/0081; H04L 25/00; H04L 25/0272; H04L 25/028
USPC ....................................................... 327/108
See application file for complete search history.

(56) References Cited

U.S. PATENT DOCUMENTS

| | | | |
|---|---|---|---|
| 9,676,277 | B2 | 6/2017 | Schwarz et al. |
| 2013/0033908 | A1* | 2/2013 | Schwarz ................ B60L 3/003 363/55 |
| 2013/0328514 | A1* | 12/2013 | Funaba .................. B60L 3/003 318/519 |
| 2015/0115718 | A1* | 4/2015 | Yoshida .............. H02M 7/5387 307/63 |
| 2017/0229952 | A1 | 8/2017 | Yoshida et al. |

FOREIGN PATENT DOCUMENTS

| | | |
|---|---|---|
| JP | H07-058615 | 3/1995 |
| JP | 2000-014184 | 1/2000 |
| JP | 2013-506390 | 2/2013 |
| JP | 5433608 | 3/2014 |
| JP | 5638079 | 12/2014 |
| JP | 5648000 | 1/2015 |
| JP | 2015-082810 | 4/2015 |

* cited by examiner

UPPER SIGNAL

POWER CONVERSION DEVICE

CROSS-REFERENCE TO RELATED APPLICATIONS

The present application is a continuation application of International Application No. PCT/JP2017/028705 filed on Aug. 8, 2017, which claims priority to Japanese Patent Application No. 2016-156118 filed on Aug. 9, 2016. The contents of these applications are incorporated herein by reference in their entirety.

BACKGROUND OF THE INVENTION

1. Field of the Invention

The present invention relates to a power conversion device including an inverter that drives a rotating electric machine such as a motor.

2. Description of the Related Art

A technique is known in which, in an electrical system, including an inverter and a rotating electric machine, used for an electric vehicle such as a hybrid car, in the case where some error occurs in a part included in the system, in order to protect the system from permanent damage, a semiconductor switching element included in the inverter is operated to be switched to a short circuit mode in which the winding of the rotating electric machine is short-circuited.

Here, a method will be described in which the switching elements included in the inverter are controlled to short-circuit the winding of the rotating electric machine. In order to short-circuit the winding of the rotating electric machine, for example, as illustrated in FIG. 8, in an electrical system including a three-phase inverter 200 and a rotating electric machine 300, the three-phase inverter 200 including a direct current power supply 100, a smoothing capacitor 201, and a DC/AC conversion unit 202, the three switching elements included in a lower-arm (low-voltage side) of the inverter 200 may be turned on, and the three switching elements included in an upper-arm (high-voltage side) of the inverter 200 may be turned off. Further, alternatively, the three switching elements included in a lower-arm of the inverter 200 may be turned off, and the three switching elements included in an upper-arm of the inverter 200 may be turned on.

Meanwhile, the error in a part included in the system includes an error in a drive circuit or a control circuit that drives the switching elements of the inverter 200, and includes an error in a power supply circuit that supplies power to these circuits (not shown). However, when an error occurs in a power supply circuit, for example, even if the switching to the short-circuit mode is intended to be performed to protect the system, it is impossible to control the switching elements, and thus, the short-circuiting operations cannot be performed.

A means (unit) for solving the above problem is described in, for example, Patent Document 1. FIG. 9 is a circuit diagram illustrating a conventional technique described in Patent Document 1. In FIG. 9, 401 denotes a DC/DC converter, 402 denotes an operation state detection device, 403 is a control circuit, 404 is a switching device, and the same reference numerals in FIG. 8 are given to the corresponding other parts.

In this conventional technique, normally, a direct current voltage (low voltage) $U_1$ from an external power supply is provided as power to the control circuit 403. The operation state detection device 402 monitors voltages, currents, etc., of parts including the voltage $U_1$. In the case where abnormality of the voltage $U_1$ is detected, a voltage (high voltage) $U_2$ of a direct current power supply 100 is converted to a predetermined value via the DC/DC converter 401, the converted voltage is supplied to the control circuit 403, and the switching elements are continued to be controlled. In other words, in this conventional technique, the power supply circuit failure is handled by providing redundancy of power supply for the control circuit 403 by using a low-voltage power supply and a high-voltage power supply.

In general, it is necessary to provide a drive circuit of switching elements included in an inverter with an isolated power supply circuit that is isolated from a control circuit. In Patent Document 1, as there is no description about this type of isolated power supply circuit, even if the redundancy of power supply is provided, the above-described short-circuit mode cannot be realized in the case of a power supply circuit failure.

With respect to the above, in Patent Document 2, a technique is disclosed in which not only redundancy of a power supply source for a drive circuit is provided according to a low-voltage power supply and a high-voltage power supply, but also redundancy of a power supply circuit that generates power supplied to the drive circuit is provided.

FIG. 10 is a block diagram illustrating this conventional technique, and illustrating a structure of one phase of an inverter (three-phase inverter) that drives a rotating electric machine. In FIG. 10, 501 denotes a power supply unit as a low-voltage power supply, 502 denotes a phase power supply unit as a drive circuit power supply circuit, 503 denotes an emergency operation control unit, 504 denotes a comparator circuit that monitors an output voltage of the phase power supply unit 502, 505 denotes a comparator circuit that monitors an output voltage of a drive circuit auxiliary power supply circuit 507, 506 denotes a power supply network as a high-voltage power supply, 508 denotes an OR circuit, 509 denotes a control unit, 510 denotes a drive circuit, 511 denotes a switch, 512 denotes a switching control means, and 513 denotes an inverter main circuit as an output stage. It should be noted that A and B indicate threshold values, and C indicates an emergency operation control signal.

In this conventional technique, normally, power is supplied to the drive circuit 510 from the power supply unit 501 via the phase power supply unit 502 and the OR circuit 508. Further, in the case of a failure of the power supply unit 501 or the phase power supply unit 502, the power is supplied to the drive circuit 510 from the power supply network 506 via the drive circuit auxiliary power supply circuit 507 and the OR circuit 508.

FIG. 11 is an overall configuration diagram of an inverter 500 described in Patent Document 2. The inverter 500 includes the power supply unit 501, the control unit 509, and other parts, provided for three phases, that share in common the power supply unit 501 and the control unit 509. In FIG. 11, 514U, 514V, and 514W denote output stage units that have the same structure, 515 denotes a battery as a high voltage power supply, 516 denotes a switch, and the same reference numerals in FIG. 10 are given to the corresponding other parts.

In Patent Document 2, the redundancy is provided also for the power supply circuit, by providing the phase power supply unit 502 from which low-voltage power is supplied, the drive circuit auxiliary power supply circuit 507 from which high-voltage power is supplied, etc. According to the above, even in the case of a failure of any one of the power supply circuits, the short-circuit mode of the rotating electric machine can be realized, and thus, the problem included in Patent Document 1 can be solved.

However, in Patent Document 2, as it is necessary to design the power supply circuit in all phases of the inverter 500 in such a way that the required power can be provided by any one of the low voltage power supply and the high voltage power supply, there is a problem in that the structures of the output stage units 514U, 514V, and 514W in FIG. 11 become complicated, and the inverter 500 is increased in size and cost.

It should be noted that, as described in Patent Document 1 and Patent Document 2, it is required that, in the case of a system failure, not only the short-circuiting of the winding of the rotating electric machine be performed to protect the circuit, but also, especially at an emergency such as an electric vehicle collision, the main battery be separated and an output voltage of the inverter be decreased to be equal to or less than a specified value within a predetermined time in order to secure safety of car occupants. If the short-circuit mode of the rotating electric machine is continued in the above-described state, the power, supplied to direct current bus bars of the main circuit, is stopped, and, when the power, stored in the smoothing capacitor connected between the positive and negative direct current bus bars, is used up, the power supply circuit, used for operating a winding short-circuit control circuit used for short-circuiting the winding of the rotating electric machine, is stopped. As a result, in spite of the fact that the rotating electric machine is in a power generation state, the short-circuit mode is released and a direct current bus bar voltage is increased, and thus, there is a risk in which the direct current bus bar voltage exceeds the specified value before the short-circuiting of the winding of the rotating electric machine is performed again by the operation of the winding short-circuit control circuit.

With respect to the above, a technique is described in Patent Document 3 in which the direct current bus bar voltage of the main circuit is detected, the short-circuiting of the winding of the rotating electric machine is released when the detected voltage becomes equal to or less than a preset threshold value (short-circuit OFF threshold value), and the short-circuiting of the winding is performed again in the case where the direct current bus bar voltage is increased again to exceed a threshold value (short-circuit ON threshold value).

FIG. 12 is a block diagram illustrating an inverter described in Patent Document 3. In FIG. 12, 600 denotes an inverter, 601 denotes a low-voltage power supply such as 12 [V] power supply, 602 denotes a motor control substrate, 603 denotes a gate drive substrate, 604 denotes a high-voltage dividing circuit, 605 denotes a microcomputer, 606 denotes a power supply circuit, 607 denotes a driver circuit, 608 denotes a three-phase bridge-configuration IGBT module, 609 denotes a contactor, 610 denotes a high-voltage power supply, and 611 denotes a smoothing capacitor. A rotating electric machine such as a three-phase motor is connected on the alternate current (AC) output side of the IGBT module 608 (not shown).

In this conventional technique, a power supply voltage is generated by the power supply circuit 606 that is connected to the high-voltage power supply 610, and the generated power supply voltage is supplied to the driver circuit 607 and the microcomputer 605. Further, in the case where the contactor 609 is turned off, the power supply voltage is generated by the power supply circuit 606 by using the voltage of the smoothing capacitor 611. The high-voltage dividing circuit 604 divides the positive side of the direct current bus bar voltage, and supplies the divided voltage to the microcomputer 605. By detecting the supplied voltage, the microcomputer 605 is enabled to measure a voltage of the high-voltage power supply 610 or the smoothing capacitor 611.

Further, a control power supply voltage (e.g., 12 [V]), that is supplied to the motor control substrate 602 from the low-voltage power supply 601, is input to the microcomputer 605 via a coupler, and, by detecting the control power supply voltage, the microcomputer 605 monitors normality/abnormality of the control power. Further, in the case where the abnormality of the control power is determined, in order to turn on the lower-arm IGBTs of all phases of the IGBT module 608 to perform the short-circuiting of the winding of the rotating electric machine, the microcomputer 605 outputs a three-phase short-circuit signal to the driver circuit 607.

FIG. 13 is a timing chart illustrating operations when the control power supply is lost in the inverter 600. The overall operations will be described below. When the control power supply (low-voltage power supply 601) is lost at time $t_1$, the contactor 609 is turned off according to a signal from an upper control device. As a result, the high-voltage power supply 610 is shut off, a voltage is supplied to the power supply circuit 606 from the capacitor 611, and the power supply voltage is supplied to arms of each phase of the IGBT module 608 and the microcomputer 605. Further, 12 [V] active signal from the motor control substrate 602 is turned to "Low" level, and lower-arm gate control signals are all turned off.

The microcomputer 605 determines that the power supply voltage exceeds a short-circuit ON threshold value at time $t_2$ after delay time has elapsed from time t1, and turns on the three-phase short-circuit signal and the lower-arm gate drive signal to transition to the short-circuit mode in which the short-circuiting of the three-phase winding of the rotating electric machine is performed. In this short-circuit mode, as a regenerative current from the rotating electric machine does not flow into the smoothing capacitor 611, the power supply voltage gradually decreases after time $t_2$.

Upon determining that the power supply voltage becomes less than a short-circuit OFF threshold value at time $t_3$, the microcomputer 605 turns off the three-phase short-circuit signal and the lower-arm gate drive signal at time $t_4$ after delay time has elapsed from time $t_3$. According to the above, the decrease of the power supply voltage is stopped, after time $t_4$, the smoothing capacitor 611 is charged again according to the regenerative current from the rotating electric machine, the power supply voltage is increased, and the above-described operations are repeated thereafter. In other words, when the power supplied to the main circuit of the inverter 600 shut off and the rotating electric machine is in a power generation state, the direct current bus bar voltage is maintained in a range between the preset short-circuit ON threshold value and the short-circuit OFF threshold value.

With respect to the above, a technique is disclosed in Patent Document 4 in which a serial circuit, of a discharge resistor and a switching element, is connected in parallel with a smoothing capacitor, and, when the electric vehicle is stopped, the contactor is turned off and the switching element is turned on, and the smoothing capacitor is caused to perform rapid discharging. Therefore, when an inverter is implemented by combining the short-circuit means of the winding of the rotating electric machine described in Patent Document 3 and the rapid discharge means described in Patent Document 4, it is possible to further enhance the safety measure of maintaining the direct current bus bar voltage in a predetermined range even in the case where the power supplied to the main circuit is shut off and the rotating electric machine is in a power generation mode.

CITATION LIST

Patent Document

[Patent Document 1] Japanese Unexamined Patent Application Publication No. 2000-014184 (paragraphs [0028]-[0039], FIG. 1, etc.)
[Patent Document 2] Japanese Patent Publication No. 5638079 (paragraphs [0019]-[0025], FIG. 1, FIG. 2, etc.)
[Patent Document 3] Japanese Patent Publication No. 5433608 (paragraphs [0032]-[0036], [0048]-[0056], FIG. 4, FIG. 7, etc.)
[Patent Document 4] Japanese Patent Publication No. 5648000 (paragraphs [0033]-[0036], FIG. 2, FIG. 3, etc.)

SUMMARY OF THE INVENTION

Technical Problem

As described above, as it is necessary to insulate the power supply of the drive circuit of the semiconductor switching elements, it is required that a certain insulation distance be provided on a printed circuit board. In the technique described in Patent Document 1, it is necessary to provide a predetermined insulation distance between the power supply sources, the low-voltage power supply and the high-voltage power supply, and it is also necessary to provide a predetermined insulation distance between the redundant power supply circuits. As a result, the device as a whole is further increased in size.

Further, the following new problem may occur when it is assumed that an inverter is implemented by combining the winding short-circuit means described in Patent Document 3 and the rapid discharge means described in Patent Document 4. That is, the short-circuit ON threshold value and the short-circuit OFF threshold value in FIG. 13 are set to low voltages (equal to or less than 60 [V] as described in, for example, "JIS D5305-3 Electric road vehicles—Safety specifications—Part 3: Protection of persons against electric hazards") that do not cause people to receive an electrical shock. Here, regarding the threshold value for stopping the rapid discharge in Patent Document 4 (discharge OFF threshold value), similarly, it is set to a low voltage that does not cause people to receive an electrical shock. Further, after a rapid discharge is performed according to the technique described in Patent Document 4 first, in order to prevent the rapid discharge from being performed again even if the winding short-circuit is released according to the technique described in Patent Document 3 and the direct current bus bar voltage is increased, the threshold values are set so as to satisfy the following relationship.

Specified voltage (safe voltage)>discharge OFF threshold value>short-circuit ON threshold value>short-circuit OFF threshold value FIG. 7 illustrates examples of the direct current bus bar voltage, the above-described relationship of the threshold values, the upper (lower) arm short-circuit signal, and the rapid discharge control signal. In order to avoid a risk of burning out of a discharge resistor, a sufficient margin is required for the short-circuit ON threshold value and the short-circuit OFF threshold value with respect to the discharge OFF threshold value. Therefore, the short-circuit ON threshold value and the short-circuit OFF threshold value are each set on the low-voltage side of the discharge OFF threshold value. In other words, it is necessary to design the power supply generation circuit for realizing the short-circuit mode with the direct current bus bar as a power supply source in such a way that it operates even in the case where the direct current bus bar voltage is low. With respect to the above, as there exists a device in which the maximum value of the direct current bus bar voltage is equal to or greater than 600 V during the normal operation, a range of the input voltage, of the power supply generation circuit whose power supply source is the direct current bus bar of the main circuit, tends to become wide. In order to be capable of corresponding to the above-described wide range of the input voltage, the upper limit of the operation frequency of the power supply generation circuit is constrained. As a result, there is a problem in that the peripheral parts such as a transformer are increased in size, and the size of the power supply generation circuit is increased.

Solution to Problem

In order to solve the above-described problem, according to claim 1 of the present invention, a power conversion device is provided. The power conversion device includes a first drive circuit that drives switching elements included in an upper arm for one phase, a second drive circuit that drives switching elements included in a lower arm for one phase, and a first control circuit that generates a control signal for the first and second drive circuits. The power conversion device includes a first power supply circuit and a second power supply circuit that supply power to the first drive circuit and the second drive circuit, respectively, a high-voltage power supply that supplies power to one of the first power supply circuit and the second power supply circuit, and a low-voltage power supply that supplies power to the other of the first power supply circuit and the second power supply circuit.

According to claim 2 of the present invention, the power conversion device according to claim 1 includes an error detection means that outputs an error detection signal by detecting an error of the power supply voltage of the first drive circuit or the second drive circuit, and an error signal transmission circuit that transmits the error detection signal to the first control circuit. The first control circuit transmits a control signal generated according to an error cause based on the error detection signal to the first drive circuit or the second drive circuit via a control signal transmission circuit, and turns on the switching elements included in the upper arm or the lower arm.

According to claim 3 of the present invention, the power conversion device according to claim 1 or claim 2 includes a second control circuit in which power is supplied from both the high-voltage power supply and the low-voltage power supply, and, when an error occurs, a control signal for the first drive circuit or the second drive circuit is generated, and the generated control signal is transmitted to the first drive circuit or the second drive circuit via the control signal transmission circuit.

According to claim 4 of the present invention, in the power conversion device according to claim 3, the first control circuit is enabled to operate according to power generated by the low-voltage side power supply generation circuit having the low-voltage power supply as a power supply source, and outputs, to the second control circuit, an error detection signal generated by detecting an error in a voltage supplied to the low-voltage side power supply generation circuit, in a voltage supplied to the first control circuit, or in the first control circuit itself.

According to claim 5 of the present invention, in the power conversion device according to claim 4, the second control circuit, to which the error detection signal from the first control circuit is input, in the case where an error in a voltage supplied to the low-voltage side power supply generation circuit is detected based on the error detection signal, generates a control signal that turns on the switching elements of the corresponding arm according to the corresponding drive circuit via the first power supply circuit or the second power supply circuit having the high-voltage power supply as a power supply source.

According to claim 6 of the present invention, in the power conversion device according to claim 4 or claim 5, the second control circuit, to which the error detection signal from the first control circuit is input, in the case where an error other than an error in a voltage supplied to the low-voltage side power supply generation circuit is detected based on the error detection signal, generates a control signal that turns on the switching elements of the upper arm or the lower arm according to the corresponding drive circuit via the first power supply circuit or the second power supply circuit.

According to claim 7 of the present invention, the power conversion device includes a first drive circuit that drives switching elements of the upper arm and the lower arm for one phase, a second drive circuit that drives switching elements of the other of the upper arm and the lower arm, a first control circuit that generates a control signal for the first drive circuit, and a second control circuit that generates a control signal for the second drive circuit. The power conversion device includes a first power supply that is a power supply source for the first drive circuit and the first control circuit, and includes a second power supply that is a power supply source for the second drive circuit and the second control circuit.

According to claim 8 of the present invention, in the power conversion device according to claim 7, one of the first power supply and the second power supply is a high-voltage power supply, and the other of the first power supply and the second power supply is a low-voltage power supply.

According to claim 9 of the present invention, the power conversion device according to claim 7 includes a switching means that switches from the first power supply to the second power supply when an output voltage, of a (the) power supply generation circuit that generates a predetermined power supply voltage from the first power supply, is less than a predetermined threshold value.

According to claim 10 of the present invention, in the power conversion device according to claim 9, the first power supply is a high-voltage power supply and the second power supply is a low-voltage power supply.

According to claim 11 of the present invention, the power conversion device includes a first drive circuit that drives switching elements of the upper arm and the lower arm for one phase, a second drive circuit that drives switching elements of the other of the upper arm and the lower arm, a first control circuit that generates a control signal for the first drive circuit, and a second control circuit that generates a control signal for the second drive circuit. The power conversion device includes a first power supply generation circuit and a second power supply generation circuit that have a common power supply source. Power is supplied to the first control circuit by the first power supply generation circuit and power is supplied to the second control circuit by the second power supply generation circuit.

According to claim 12 of the present invention, in the power conversion device according to any one of claims 7 to 11, the first control circuit includes a means that transmits an error detection signal to the second control circuit when an error of the first control circuit is detected, and a means that detects that the power conversion device or load has become in a predetermined operation state and that performs short-circuiting of the load by driving the switching elements of the upper arm or the lower arm according to the first drive circuit.

According to claim 13 of the present invention, in the power conversion device according to claim 12, the second control circuit includes a means that receives the error detection signal transmitted from the first control circuit, and a means that shuts off a control signal generated by the first control circuit when it is detected that the power conversion device or load has become in a predetermined operation state, and that performs short-circuiting of the load by driving the switching elements of the upper arm or the lower arm according to the second drive circuit.

According to claim 14 of the present invention, in the power conversion device according to any one of claims 7 to 11, the first control circuit includes a means that determines an error of an output voltage of the power supply generation circuit having the second power supply as a power supply source, and a means that performs short-circuiting of the load by driving the switching elements of the upper arm or the lower arm according to the first drive circuit.

According to claim 15 of the present invention, in the power conversion device according to claim 7, the first control circuit and the second control circuit include means that detect an error of an output voltage of the power supply generation circuit supplying power to corresponding control circuits, and means that perform short-circuiting of the load by driving the switching elements of the upper arm or the lower arm according to the drive circuit to which power is supplied by the other power supply generation circuit that is different from the one power supply generation circuit for which the error is determined.

According to claim 16 of the present invention, the power conversion device according to any one of claims 7 to 15, is enabled to perform: a short-circuiting operation of load by turning on the switching elements of the upper arm or the lower arm when a direct current bus bar voltage, that is a voltage between the two ends of a serial circuit of the upper arm and the lower arm, arrives at a first threshold value; an operation of releasing the short-circuiting operation when the direct current bus bar voltage arrives at a second threshold value that is less than the first threshold value; and a discharge operation of causing a smoothing capacitor, that is connected in parallel with the serial circuit, to discharge. When the direct current bus bar voltage arrives at the second threshold according to the short-circuiting operation, the discharge operation is stopped and the stopped state is maintained.

Advantageous Effects of Invention

According to claims 1 to 6 of the present invention, it is possible to protect a system and a human body by realizing a reliable short-circuit mode by controlling the switching elements via the healthy side power supply circuit and drive circuit when an error in a power supply generation circuit or an error in a voltage supplied to the power supply circuit or the control circuit, occurs. Further, it is possible to avoid causing the circuit configuration for supplying power to the drive circuit to be redundant more than necessary, and it is possible to decrease the entire size of the device according to the minimal circuit size and insulation distance.

According to claims 7, 11 of the present invention, the power supply source for the first drive circuit and the first control circuit is separated from the power supply source for the second drive circuit and the second control circuit; or, the first power supply generation circuit and the second power supply generation circuit have a power supply source in common, power is supplied to the first drive circuit and the first control circuit from the first power supply generation circuit, and power is supplied to the second drive circuit and the second control circuit from the second power supply generation circuit. According to the above, even in the case where an error occurs in one of the power supply sources or in one of the power supply generation circuits, it is still possible to supply power to the drive circuit and the control circuit for the switching elements of a predetermined arm according to the other of the power supply sources or the other of the power supply generation circuits. Further, as there is no need for redundancy in each of the phases of the power supply generation circuit, it is possible to reduce the device in size and cost.

According to claims 8 and 10 of the present invention, regarding the circuits, whose power is supplied by a high-voltage power supply source of the two power supply sources, power is supplied to circuits as long as the power remains in the high-voltage section. Therefore, it is possible to avoid losing effects of protective operations due to the loss of power supply, and it is possible to improve safety.

According to claim 9 of the present invention, even if the timing of supplying power from the first power supply is delayed compared with the second power supply, power can be supplied from the second power supply instead of the first power supply. According to the above, the start delay of the circuits, whose power is supplied by the first power supply, can be resolved, and it is possible to shorten the waiting time for the start of the power conversion device after the power on.

According to claims 12 to 15 of the present invention, it is possible to protect a system and a human body by realizing a reliable short-circuit mode by supplying power from the healthy power supply generation circuit in the case where an error of an output voltage of the power supply generation circuit is detected.

According to claim 16, it is possible to set the second threshold value, used for releasing the operation for short-circuiting of a load by turning the switching elements on, near the specified voltage (safe voltage) of the direct current bus bar voltage, and it is possible to contribute for decreasing the circuit size by enabling the operable minimum voltage of the power supply generation circuit, that generates power from the direct current bus bar, to be set at a high voltage.

DETAILED DESCRIPTION OF THE PREFERRED EMBODIMENTS

In view of the above, an object of the present invention is to provide a power conversion device that realizes minimal redundancy of the power supplying path for the power supply, the power supply generation circuit, etc.; that prevents the circuits and the entire device from increasing in size and cost; and that is enabled to realize the short-circuit mode at the time of system abnormality.

Figure 1:
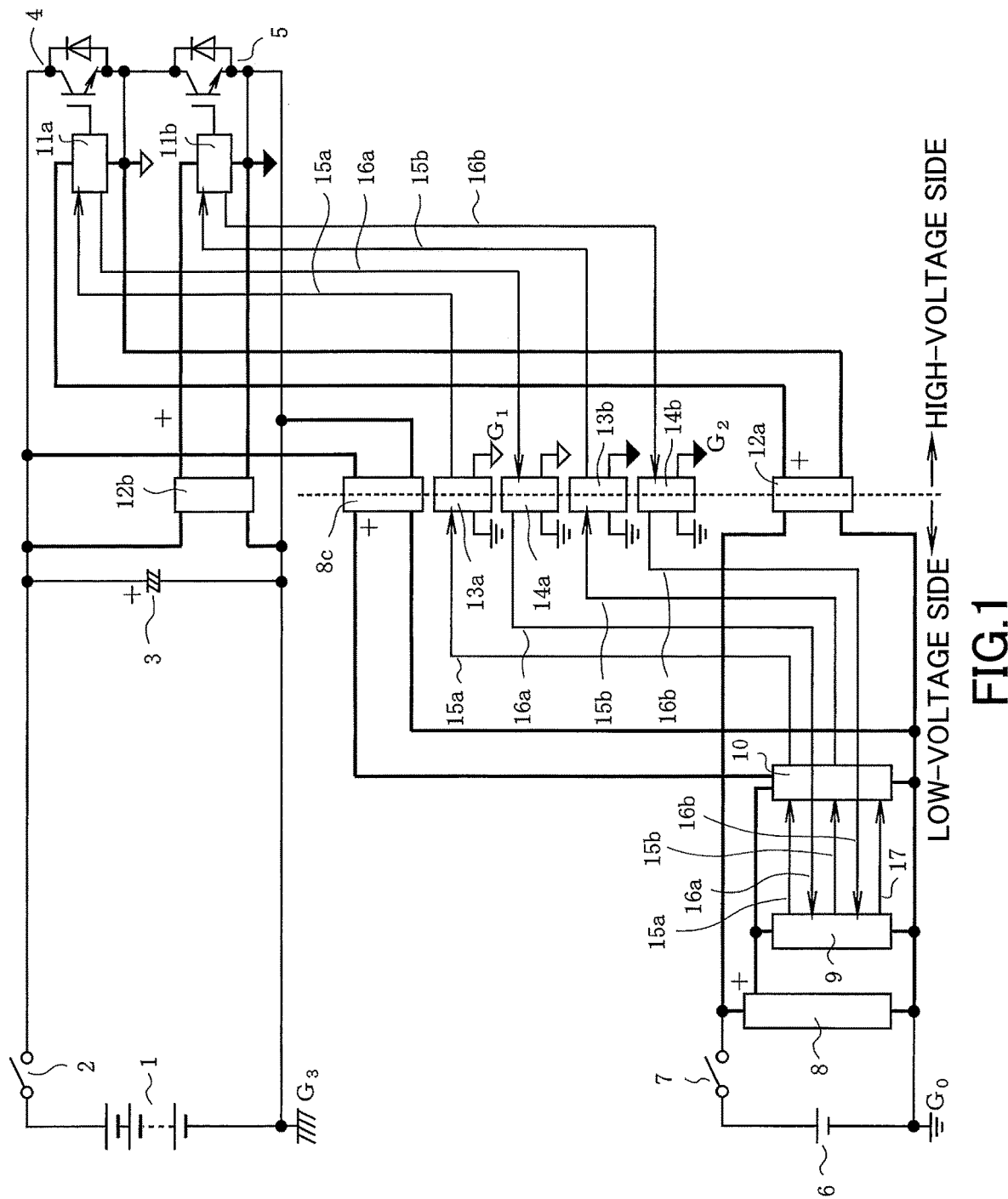
FIG. 1 is a block diagram illustrating a first embodiment of the present invention.

In the following, one or more embodiments of the present invention will be described while making reference to the drawings. FIG. 1 is a block diagram illustrating a main portion of a power conversion device according to a first embodiment of the present invention. FIG. 1 illustrates, for the sake of convenience, one of three phases of a main circuit of an inverter and a control device for the inverter. For example, switching elements and load for the other two phases of the three-phase inverter are omitted in FIG. 1. It is possible for the control device illustrated in FIG. 1 to supply power in parallel to drive circuits of the switching elements for the other two phases. It should be noted that power supply path, subsequent to a low-voltage side power supply generation circuit 8 and an lower-arm side drive circuit power supply circuit 12b, which will be described below, is indicated by a bold line.

In FIG. 1, a high-voltage power supply switch 2, such as a contactor, and a smoothing capacitor 3 are connected in series between a positive electrode and a negative electrode of a high-voltage power supply 1. Switching elements 4, 5 for one of the three phases of an inverter are connected to the smoothing capacitor 3 in series. Further, 11a is an upper-arm side drive circuit and 11b is a lower-arm side drive circuit. Power is supplied to the upper-arm side drive circuit 11a from an upper-arm side drive circuit power supply circuit 12a, which will be described below. Power is supplied to the lower-arm side drive circuit 11b from a lower-arm side drive circuit power supply circuit 12b that is connected to two ends of a smoothing capacitor 3. The power supply circuits 12a, 12b have a function for converting an input voltage to a predetermined voltage and for supplying the converted voltage to the drive circuits 11a, 11b, respectively.

Meanwhile, a low-voltage side power supply generation circuit 8 and an upper-arm side drive circuit power supply circuit 12a are connected in parallel between a positive electrode and a negative electrode of a low-voltage power supply 6, via a low-voltage power supply switch 7. Power is supplied to a first control circuit 9 and a second control circuit 10 from the low-voltage side power supply generation circuit 8. Further, power is supplied to the second control circuit 10 also from a control circuit auxiliary power supply 8c that is connected to both ends of the smoothing capacitor 3. Although not shown in FIG. 1, power may be supplied to the lower-arm drive circuit 11b from the power supply circuit 12a whose power supply source is the low-voltage power supply 6 by using the power supply circuit 12a as the lower-arm side drive circuit power supply circuit, and power may be supplied to the upper-arm side drive circuit 11a from the power supply circuit 12b whose power supply source is the high-voltage power supply 1 by using the power supply circuit 12b as the upper-arm side drive circuit power supply circuit.

The first control circuit 9 has a function for generating control signals 15a, 15b used for turning on/off the switching elements 4, 5, and for generating an error detection signal 17 that indicates an error in a supply voltage to the low-voltage side power supply generation circuit 8 (voltage of the low-voltage power supply 6), an error in a supply voltage to the first control circuit 9, or an error of the first control circuit 9 itself. The signals 15a, 15b, 17 are transmitted to the second control circuit 10. The control signal 15a for the upper-arm switching element 4 is transmitted to the drive circuit 11a via the second control circuit 10 and a control signal transmission circuit 13a, and the control signal 15b for the lower-arm switching element 5 is transmitted to the drive circuit lib via the second control circuit 10 and a control signal transmission circuit 13b.

Further, the drive circuits 11a, 11b respectively generate error detection signals 16a, 16b that indicate an error in power supplied to themselves, and transmit the generated error detection signals 16a, 16b to the first control circuit 9 via error signal transmission circuits 14a, 14b. The above-described "an error in power supplied to themselves" includes an error of the low-voltage power supply 6 or the high-voltage power supply 1 detected via the power supply circuits 12a, 12b; an error of the low-voltage side power supply generation circuit 8; an error according to disconnection of power supply lines; an error of the power supply circuits 12a, 12b, etc.

Here, in general, a reference potential of the control circuits and a reference potential of the switching elements are different. Therefore, as illustrated in FIG. 1, the reference potentials for blocks including the circuits are separated from each other. In other words, $G_0$ is a reference potential including the low-voltage power supply 6, the low-voltage side power supply generation circuit 8, the first control circuit 9, the second control circuit 10, and the low-voltage side of the transmission circuits 13a, 13b, 14a, 14b; $G_1$ is a reference potential of the high-voltage side of the transmission circuits 13a, 14a; $G_2$ is a reference potential of the high-voltage side of the transmission circuits 13b, 14b, and $G_3$ is a reference potential of a main circuit.

The control signal transmission circuits 13a, 13b respectively insulate the control signals 15a, 15b with reference potential $G_0$, convert the insulated signals to signals with different reference potentials $G_1$, $G_2$, and transmit the converted signals to the drive circuits 11a, 11b. Further, the error signal transmission circuits 14a, 14b respectively insulate error detection signals 16a, 16b with different reference potentials $G_1$, $G_2$, convert the insulated signals to signal with the same reference potential $G_0$, and transmit the converted signals to the first control circuit 9.

Normally, circuit parts using a light insulation means or a magnetic insulating means are used for the signal insulation circuits including the transmission circuits 13a, 13b, 14a, 14b, and it is necessary to supply power to the high-voltage side and to the low-voltage side of the circuit parts via the insulation portion. In FIG. 1, a means for supplying power to the low-voltage side and to the high-voltage side of the transmission circuits 13a, 13b, 14a, 14b is not shown. The means for supplying power may be realized as described below.

In other words, power may be supplied to the low-voltage side of the transmission circuits 13a, 14a from the low-voltage power supply 6, or may be supplied from the power supply 1 and the power supply 6 by using the low-voltage power supply 6 and the high-voltage power supply 1 as a supply source (regarding the high-voltage power supply 1, it should be insulated before being used for supplying power). Power may be supplied to the high-voltage side of the transmission circuits 13a, 14a from the low-voltage power supply 6 as a supply source by insulating before supplying. Further, power may be supplied to the low-voltage side of the transmission circuits 13a, 14a from the high-voltage power supply 1 as a supply source by insulating before supplying, or may be supplied from the power supply 1 and the power supply 6 by using the low-voltage power supply 6 and the high-voltage power supply 1 as a supply source (regarding the high-voltage power supply 1, it should be insulated before being used for supplying power). Power may be supplied to the high-voltage side of the transmission circuits 13b, 14b from the high-voltage power supply 1. Here, as a means for supplying power to each of the transmission circuits using the high-voltage power supply 1 and the low-voltage power supply as a power supply source, a means similar to a means for supplying power to the second control circuit 10, that will be described below, may be used.

Figure 2:
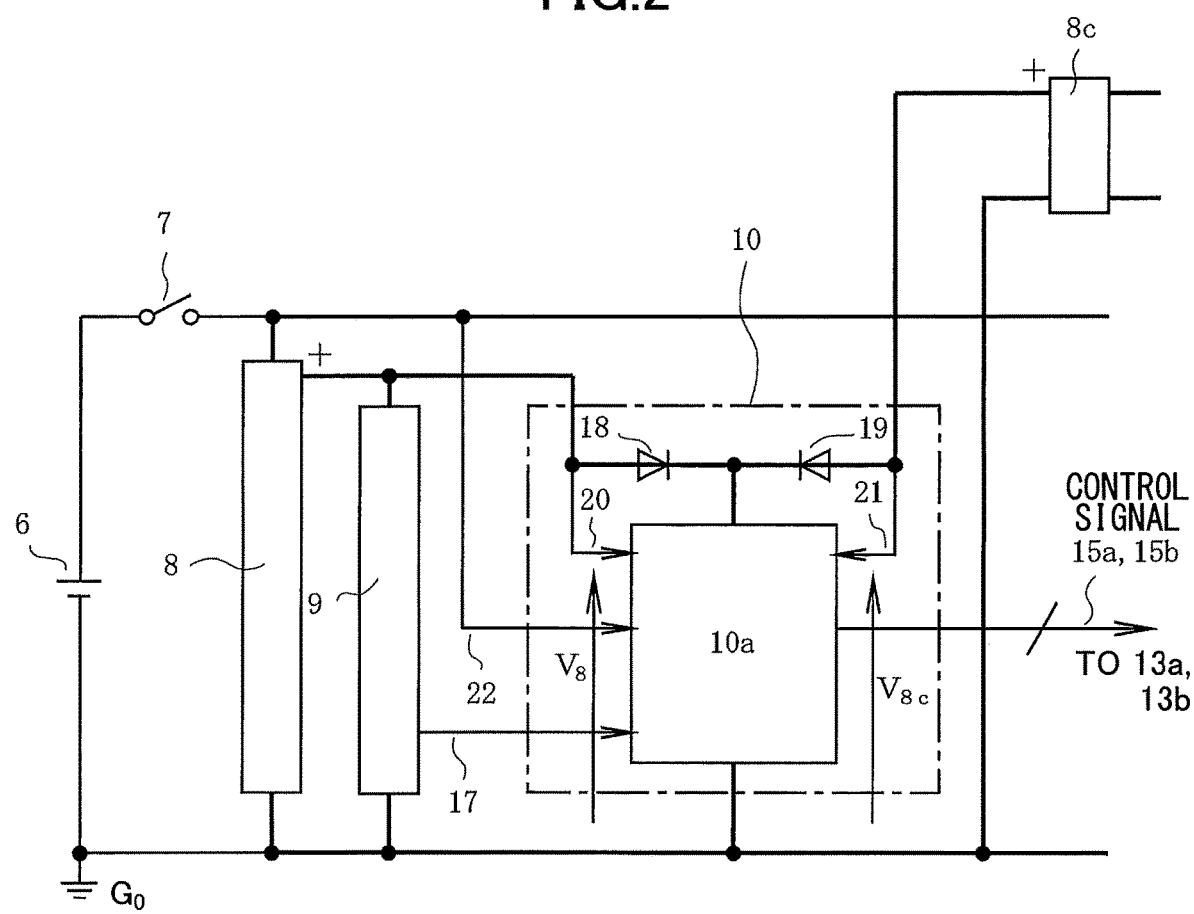
FIG. 2 is a structure diagram of a main portion in FIG. 1.

Next, FIG. 2 is a structure diagram of a main portion in FIG. 1, and mainly illustrates a structure of the second control circuit 10. As illustrated in FIG. 2, a voltage generated by the low-voltage side power supply generation circuit 8 with the low-voltage power supply 6 as a power supply source, and a voltage generated by the control circuit auxiliary power supply 8c with the high-voltage power supply 1 as a power supply source, are input to a processing unit 10a, via a diode 18 and a diode 19, respectively, the diodes 18 and 19 facing each other.

At this time, for example, by setting the voltage V8 generated by the low-voltage side power supply generation circuit 8 to 5.0 [V], and by setting the voltage V8c generated by the control circuit auxiliary power supply 8c to a voltage less than 5.0 [V], for example, 4.5 [V], it is possible to supply power to the processing unit 10a from the low-voltage side power supply generation circuit 8 when the low-voltage side power supply generation circuit 8 is normal. Further, when it becomes impossible to supply power from the low-voltage side power supply generation circuit 8 due to an occurrence of an error of the low-voltage power supply 6 or of the low-voltage side power supply generation circuit 8, it is possible to supply power to the processing unit 10a from the control circuit auxiliary power supply 8c. In FIG. 2, 20 indicates a detection signal of the voltage V8, 21 indicates a detection signal of the voltage V8c, and 22 indicates a detection signal of the voltage of the low-voltage power supply 6.

Further, a method described below may be used other than the method in which the voltages generated by the low-voltage side power supply generation circuit 8 and the control circuit auxiliary power supply 8*c* are input to the processing unit 10*a* via the diodes 18, 19 facing each other. That is, switches (not shown) may be provided, respectively, for the low-voltage side power supply generation circuit 8 and the control circuit auxiliary power supply 8*c*. In the case where an error is detected in the voltage generated by the low-voltage side power supply generation circuit 8, the switches may be operated so as to shut off the power supplied from the low-voltage side power supply generation circuit 8, and so as to cause power to be supplied to the processing unit 10*a* from the control circuit auxiliary power supply 8*c*.

Here, as described above, it is possible to supply power to the processing unit 10*a* from the high-voltage power supply 1 via the control circuit auxiliary power supply 8*c*. Therefore, in the case where: an error occurs in the low-voltage power supply 6; an error occurs in the first control circuit 9; or an error occurs in the voltage supplied to the first control circuit 9 from the low-voltage side power supply generation circuit 8, it is possible to generate control signals 15*a*, 15*b* used for realizing a short-circuit mode by turning on the switching element 4 or 5, and to transmit the generated control signals 15*a*, 15*b* to the drive circuits 11*a*, 11*b* via the control signal transmission circuits 13*a*, 13*b*.

Next, overall operations according to an embodiment of the present invention will be described. As described above, in an embodiment of the present invention, the power supply sources of the power supply circuits 12*a*, 12*b* for the drive circuit 11*a*, 11*b* are separated into the low-voltage power supply 6 and the high-voltage power supply 1. Therefore, in the case where all of the power supply paths including the power supplies 6, 1, the low-voltage side power supply generation circuit 8, and the power supply circuits 12*a*, 12*b* are normal, the drive circuits 11*a*, 11*b* respectively turn on/off the switching elements 4, 5 according to the control signals 15*a*, 15*b*.

Further, for example, in the case where an error (including an error due to disconnection of connection lines to the low-voltage power supply 6) occurs in the upper-arm side power supply circuit 12*a*, power is not supplied to the drive circuit 11*a* and it becomes impossible to control the switching element 4. However, if the lower-arm side power supply circuit 12*b* operates normally (it is assumed that the possibility of an occurrence of a simultaneous error in the power supply paths including the power supply circuits 12*a*, 12*b* is very low), it is possible to turn on the switching element 5 according to an operation of the drive circuit 11*b*. Therefore, in the case of the three-phase inverter, it is possible to protect a system by realizing the short-circuit mode in which the short-circuiting of the winding of the rotating electric machine as a load is performed by turning on all of the three-phase lower-arm switching elements 5 by performing the above operations. In the case where an error occurs in the power supply paths including the lower-arm side power supply circuit 12*b*, similar to the above, it is possible to realize the short-circuit mode by turning on the switching element 4 according to the normally-operating upper-arm side power supply circuit 12*a* and the drive circuit 11*a*.

It is possible to determine which of the power supply circuits 12*a*, 12*b*, an error occurs in, according to the first control circuit 9 to which the error detection signals 16*a*, 16*b* are input. It is possible for the first control circuit 9 to generate appropriate corresponding control signals 15*a*, 15*b* based on the determination result. These control signals 15*a*, 15*b* are relayed by the processing unit 10*a* in the second control circuit 10, whose power is supplied from the low-voltage side power supply generation circuit 8 or the control circuit auxiliary power supply 8*c*, and are transmitted to the drive circuits 11*a*, 11*b* via the control signal transmission circuits 13*a*, 13*b*.

Further, in the case where an error detection signal 17, that indicates an error in a voltage of the low-voltage power supply 6, indicates an error in a voltage supplied to the first control circuit 9, or indicates an error in the first control signal 9 itself, is input, the processing unit 10*a*, whose power is supplied from the control circuit auxiliary power supply 8*c*, may generate a control signal 15*b* for the high-voltage power supply 1 side drive circuit 11*b* to turn on the switching element 5. Here, the above-described process, that is performed by the processing unit 10*a*, is a limited process, and thus, the capacity of the power supply necessary for the redundant power supply for the processing unit 10*a* may also be limited (may be low), and there is no risk of increased circuit size.

It should be noted that the short-circuit mode can be realized according to the similar operations even in the case where an error, other than the error in the power supply path including the power supply circuits 12*a*, 13*b*, is detected by the drive circuits 11*a*, 11*b*.

As described above, according to the first embodiment of the present invention, when an error occurs in the power supply generation circuit or in the power supply circuit, or, when an error occurs in the voltage supplied to the power supply circuit or the control circuit, it is possible to reliably realize the short-circuit mode, in which the short-circuiting of the winding of the rotating electric machine as a load is performed, by causing the healthy side power supply circuit and the drive circuit to operate to control the switching element. Further, it is possible to avoid causing the power supply or the power supply circuit to be redundant more than necessary, and it is possible to decrease the entire size of the device according to the minimal circuit size and insulation distance.

Figure 3:
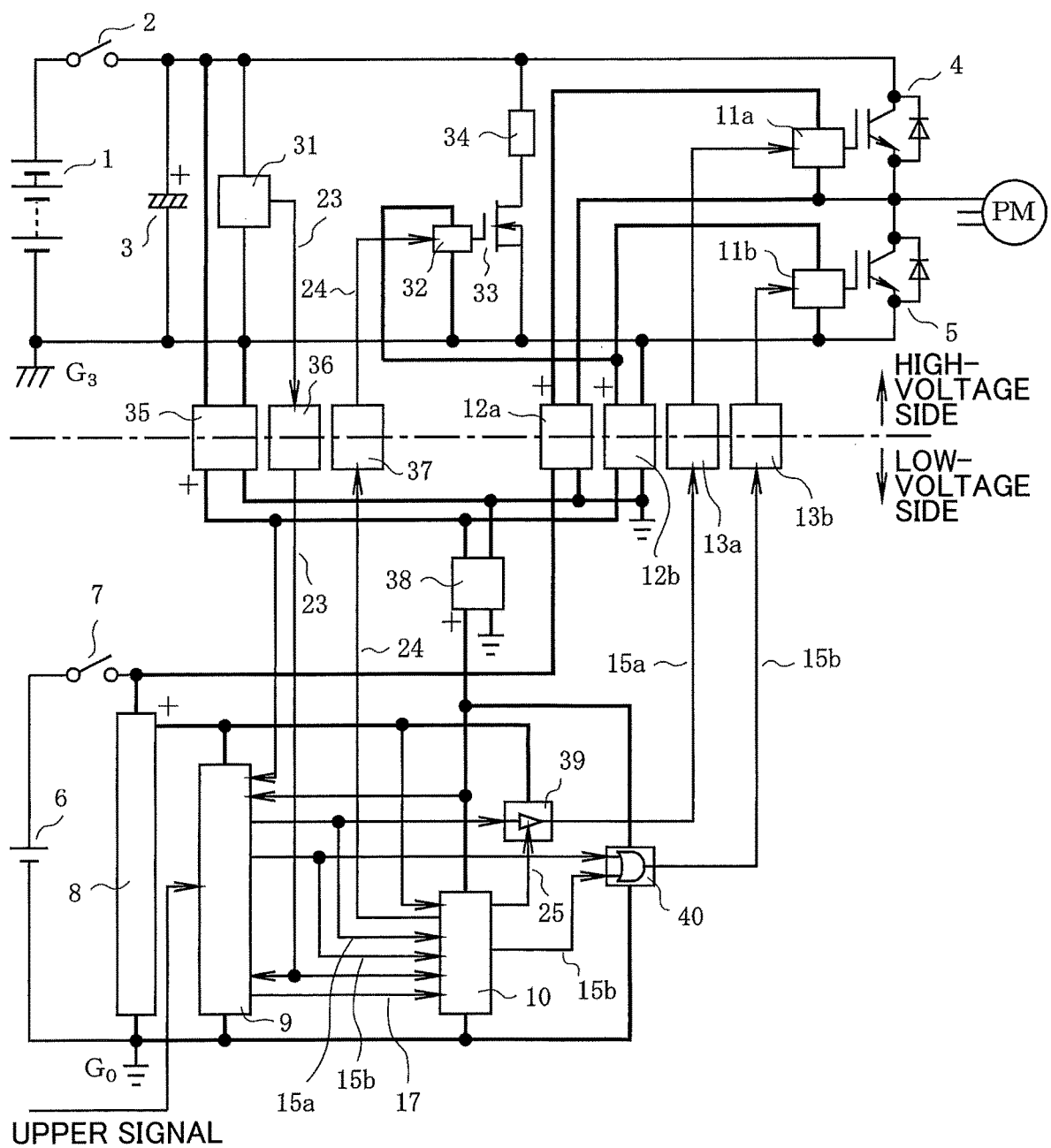
FIG. 3 is a block diagram illustrating a second embodiment of the present invention.

Next, a second embodiment of the present invention will be described. FIG. 3 is a block diagram illustrating the second embodiment of the present invention. In FIG. 3, a portion, that has the same function as in FIG. 1, is given the same reference code, and the descriptions are omitted. In the following, points that are different from FIG. 1 will be described.

FIG. 3 illustrates upper-arm and lower-arm switching elements, that are connected to a stator winding for one phase of a permanent magnet synchronous motor PM as a load, and a control device. Power may be supplied in parallel to drive circuits of switching elements for other two phases from the control device illustrated in FIG. 3. It should be noted that, in an embodiment of the present invention described below, the power supply path, subsequent to a low-voltage side power supply generation circuit 8 and a high-voltage side power supply generation circuit 35, which will be described below, is indicated by a bold line.

In FIG. 3, a voltage detection circuit 31 is connected in parallel with a smoothing capacitor 3 of the main circuit. Further, a discharge circuit, including a switching element 33 and a discharge resistor 34 connected in series, is connected in parallel with the smoothing capacitor 3. The switching element 33 is driven by a discharge drive circuit 32, and a discharge control signal 24 is input to the discharge drive circuit 32 via a control signal transmission circuit 37. Power is supplied to the discharge drive circuit 32 from a lower-arm side drive circuit power supply circuit 12*b*.

A high-voltage side power supply generation circuit 35 is connected between positive and negative direct current bus bars of the main circuit. An output voltage of the high-voltage side power supply generation circuit 35 is input to a second low-voltage side power supply generation circuit 38 and a lower-arm side drive circuit power supply circuit 12b. Further, a voltage detection signal 23 output from the voltage detection circuit 31 is input to the first control circuit 9 and the second control circuit 10 via a control signal transmission circuit 36. Here, an upper-arm side drive circuit power supply circuit 12a, the lower-arm side drive circuit power supply circuit 12b, and the high-voltage side power supply generation circuit 35 may be integrated into a single circuit by using a multiple-output transformer.

With respect to the above, a power supply voltage from a first low-voltage side power supply generation circuit 8 is supplied to a first control circuit 9 on the low-voltage side, and signals for detecting power supply voltages generated by the high-voltage side power supply generation circuit 35 and the second low-voltage side power supply generation circuit 38 are input to the first control circuit 9 on the low-voltage side. Further, an error detection signal, indicating an error of devices and circuits included in the system, that is output from an upper control device is input, as an upper signal, to the first control circuit 9. The upper signal may include, similar to FIG. 1, error detection signals 16a, 16b from the upper-arm side drive circuit 11a and the lower-arm side drive circuit 11b.

The power generated by the second low-voltage side power supply generation circuit 38 is supplied to the second control circuit 10, and a signal for detecting the power supply voltage generated by the first low-voltage side power supply generation circuit 8 is input to the second control circuit 10. Further, control signals 15a, 15b, a voltage detection signal 23, and an error detection signal 17 are input to the second control circuit 10. A control signal 25 for a tri-state buffer 39 and a discharge control signal 24 for the control signal transmission circuit 37 are output from the second control circuit 10.

Power is supplied to the three-state buffer 39 from the first low-voltage side power supply generation circuit 8. The tri-state buffer 39 outputs a control signal 15a for the upper-arm side drive circuit 11a by switching the control signal 15a to a "High" level, a "Low" level, or a "High impedance state". The power generated by second low-voltage side power supply generation circuit 38 is also supplied to an OR circuit 40. The OR circuit 40 outputs a control signal 15b for the lower-arm side drive circuit 11b output from the first control circuit 9 or the second control circuit 10.

Next, operations according to the second embodiment of the present invention will be described. In the case where all of the circuits including the high-voltage power supply 1 and the low-voltage power supply 6 are normal, power is supplied to the upper-arm side drive circuit 11a via the first low-voltage side power supply generation circuit 8 and the upper-arm side drive circuit power supply circuit 12a, and power is supplied to the lower-arm side drive circuit 11b and the discharge drive circuit 32 via the high-voltage side power supply generation circuit 35 and the lower-arm side drive circuit power supply circuit 12b. Further, power is supplied to the first control circuit 9 the first low-voltage side power supply generation circuit 8, and power is supplied to the second control circuit 10 from the second low-voltage side power supply generation circuit 38.

When the first control circuit 9 or the second control circuit 10 detects that a direct current bus bar voltage exceeds a predetermined threshold value based on the voltage detection signal 23 from the voltage detection circuit 31, the first control circuit 9 or the second control circuit 10 generates a control signal for performing short-circuiting of the winding of the synchronous motor PM by controlling the switching elements 4, 5 according to the upper-arm side drive circuit 11a or the lower-arm side drive circuit 11b. Further, the second control circuit 10 generates a discharge control signal 24 for causing the discharge circuit (the switching element 33 and the discharge resistor 34) to operate via the discharge drive circuit 32.

Even if an error (including a power loss) occurs in the high-voltage power supply 1 or an error occurs in the high-voltage side power supply generation circuit 35, as long as the low-voltage power supply 6, the first low-voltage side power supply generation circuit 8, and the first control circuit 9 are normal, it is possible to generate a control signal for performing short-circuiting of the winding of the synchronous motor PM by controlling the upper-arm switching element 4 according to the upper-arm side drive circuit power supply 12a via the first control circuit 9. Furthermore, even if an error occurs in the high-voltage power supply 1, as long as the power remains in the smoothing capacitor 3 and the high-voltage side power supply generation circuit 35 and the lower-arm side drive circuit power supply circuit 12b are normal, it is possible to control the lower-arm switching element 5 by supplying power to the lower-arm side drive circuit 11b.

Further, in the case where an error (including a power loss) occurs in the low-voltage power supply 6 or an error occurs in the first low-voltage side power supply generation circuit 8, power is not supplied to the upper-arm side drive circuit power supply circuit 12a and the upper-arm side drive circuit 11a and it becomes impossible to control the upper-arm switching element 4. However, as long as the high-voltage power supply 1, the high-voltage side power generation circuit 35, the lower-arm side drive circuit power supply circuit 12b, and the lower-arm side drive circuit 11b are normal, it is possible to control the lower-arm switching element 5, and thus, there is no problem in the operation for performing short-circuiting of the winding of the synchronous motor PM. Further, it is possible to indirectly supply power to the lower-arm side drive circuit power supply circuit 12b from the high-voltage power supply 1. Therefore, as long as the lower-arm side drive circuit power supply circuit 12b is normal, it is always possible to supply power to the discharge drive circuit 32, and it is also possible to perform discharging of the smoothing capacitor 3 according to the operation of the discharge circuit.

Figure 11:
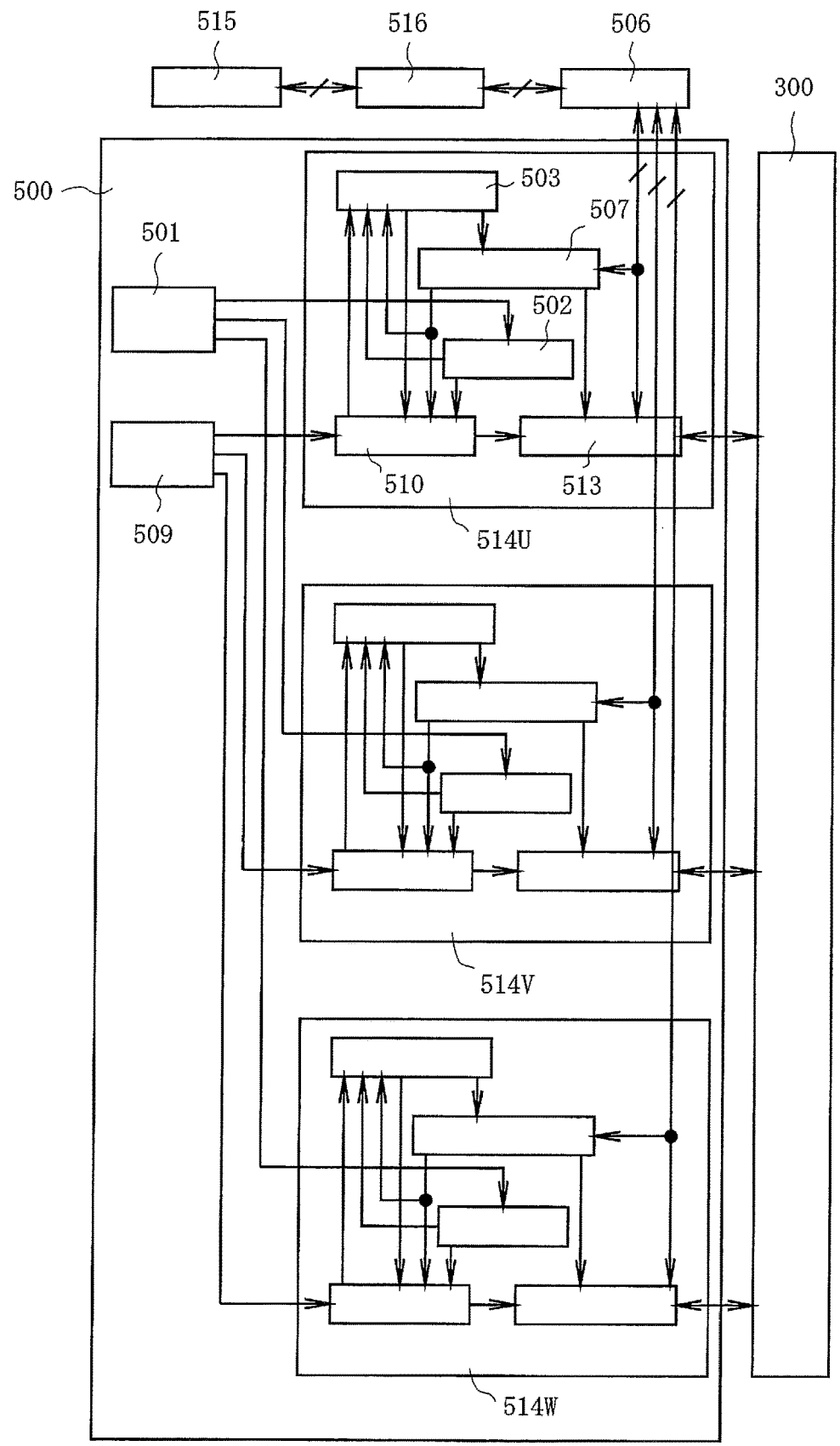
FIG. 11 is a block diagram illustrating an overall structure of an inverter described in Patent Document 2.
Figure 12:
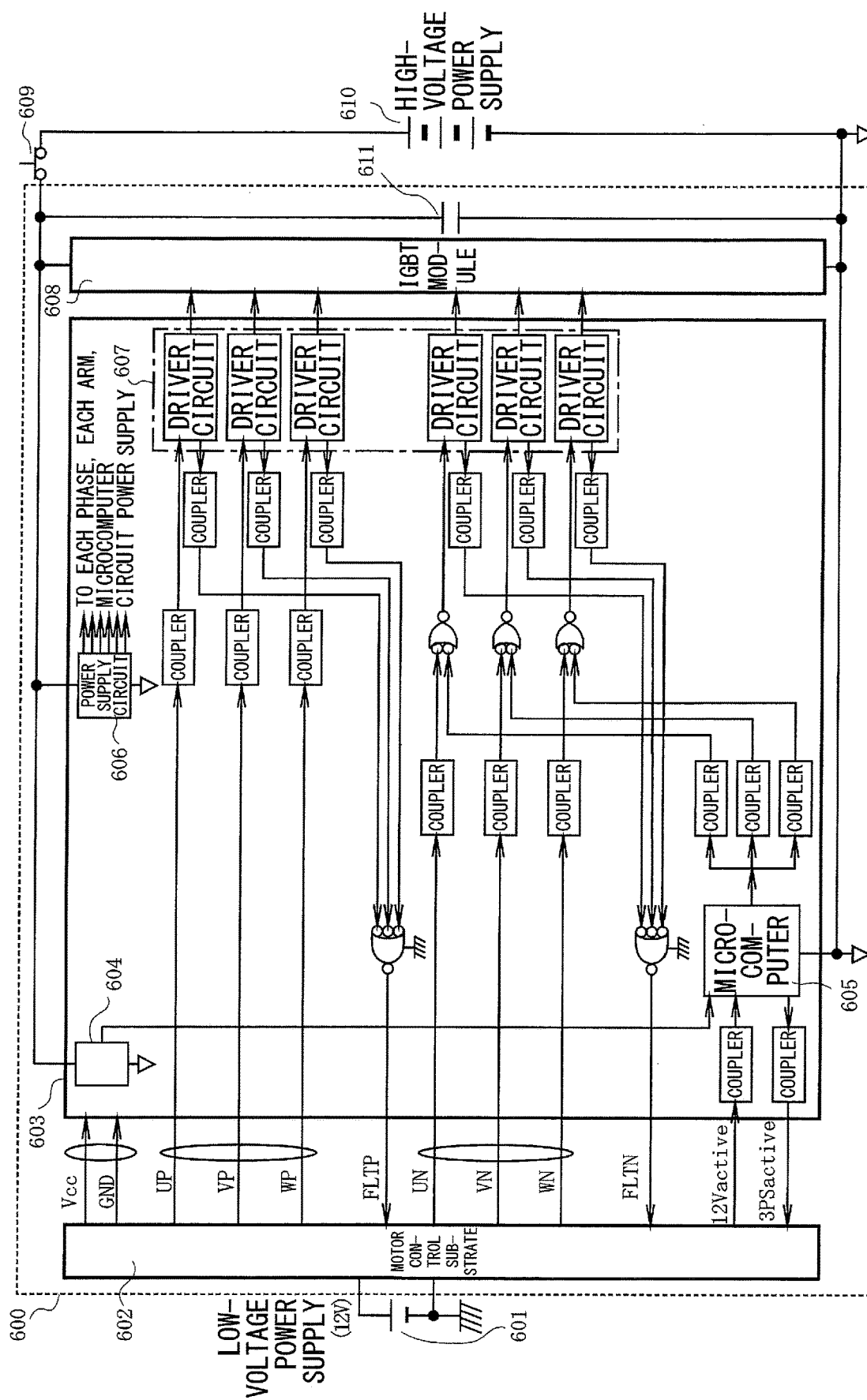
FIG. 12 is a block diagram illustrating an overall structure of an inverter described in Patent Document 3.
Figure 13:
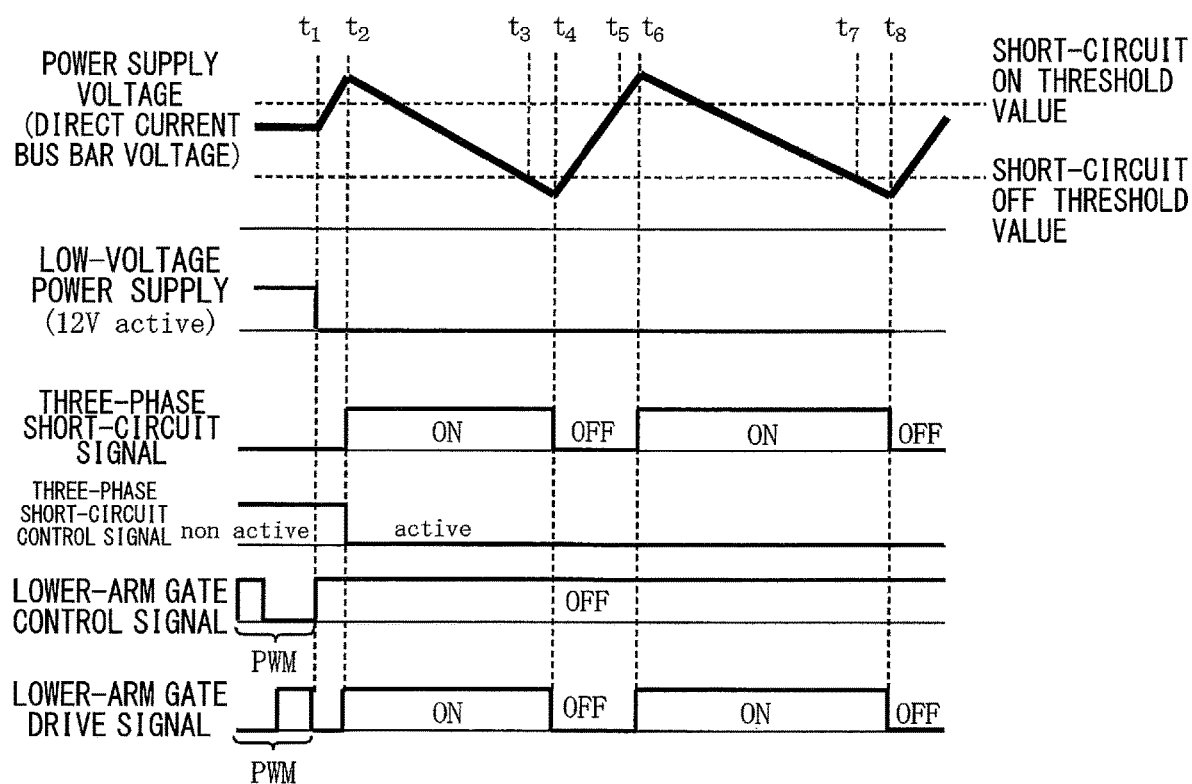
FIG. 13 is a timing chart illustrating operations when the control power supply is lost in the inverter described in Patent Document 3.

As described above, in an embodiment of the present invention, the power supply paths for the upper-arm side drive circuit 11a and the lower-arm side drive circuit 11b are separated. Further, because the possibility of an occurrence of simultaneous errors in the power supply path according to the high-voltage power supply 1 and in the power supply path according to the low-voltage power supply 6 is very low, it is not necessary to cause the power supply generation circuit, etc., to be redundant more than necessary. Therefore, it is possible to improve reliability and safety by always being capable of realizing the short-circuit mode according to the switching element 4 or 5. Further, it is possible to supply power to the drive circuits of the upper-arm and the lower-arm switching elements for the other two phases included in the three-phase inverter in a parallel manner from the control device in FIG. 3. Therefore, it is not necessary to provide the power generation circuit for each phase as in Patent Document 2 (FIG. 11), and it is possible to reduce the entire control device in size and cost.

Figure 4:
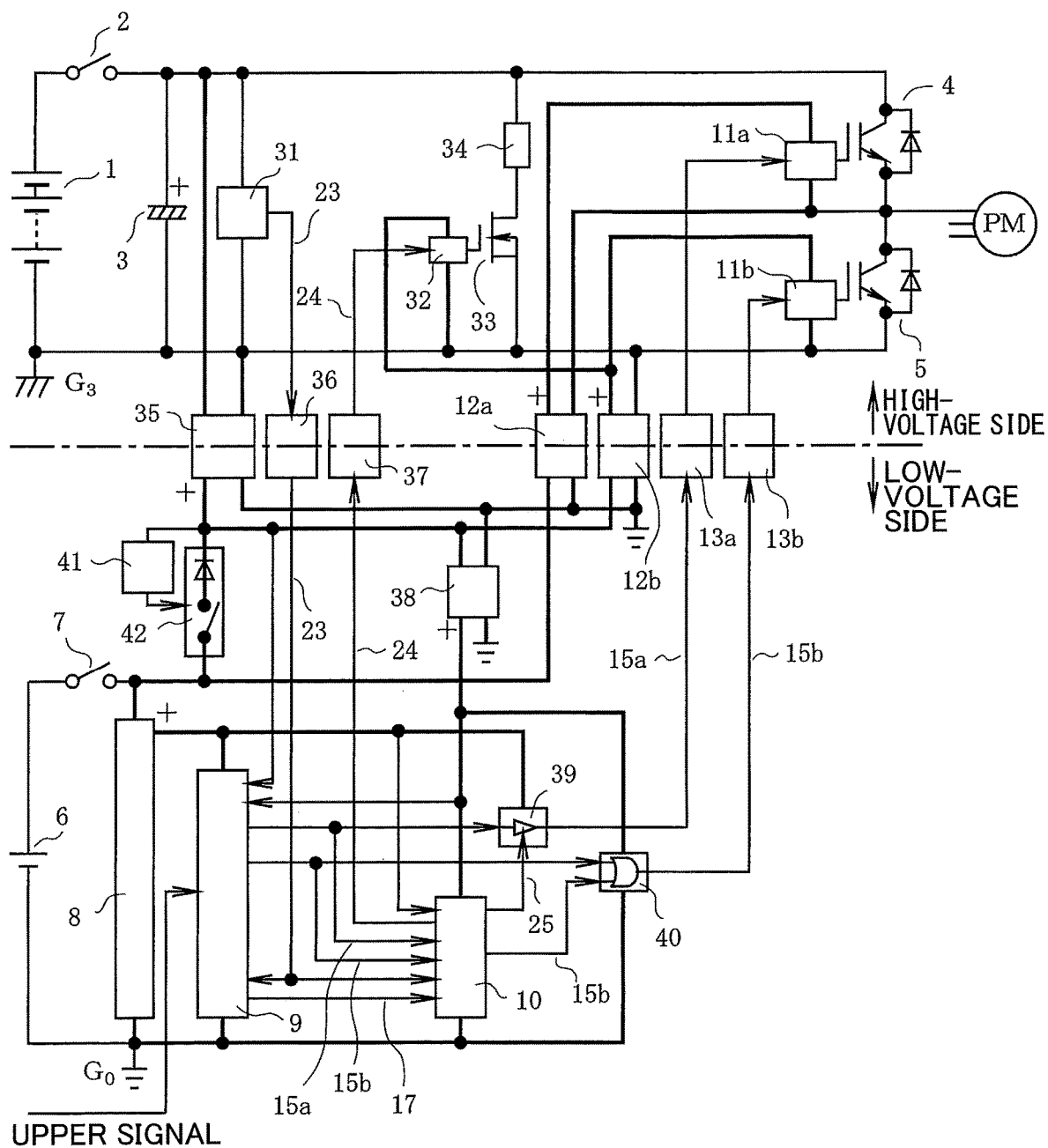
FIG. 4 is a block diagram illustrating a third embodiment of the present invention.

Next, a third embodiment of the present invention will be described while making reference to FIG. 4. FIG. 4 is a block diagram illustrating the third embodiment. In the following, differences from FIG. 3 will be mainly described. In the third embodiment illustrated in FIG. 4, a single-direction switch 42 is connected between the positive side output terminal of the first low-voltage side power supply generation circuit 8 and the positive side output terminal of the high-voltage side power supply generation circuit 35. Further, a voltage monitor circuit 41, that detects whether a positive side output voltage of the high-voltage side power supply generation circuit 35 becomes less than a predetermined threshold value, is provided. The single-direction switch 42 is turned on according to an output signal of the voltage monitor circuit 41.

In the third embodiment, for example, in the case where an error occurs in the high-voltage power supply 1 or the high-voltage side power supply generation circuit 35, or, in the case where the positive side output voltage of the high-voltage side power supply generation circuit 35 becomes less than the predetermined threshold value according to the delayed power supply timing due to the power supply path, the single-direction switch 42 is turned on. According to the above, a power supply voltage according to the first low-voltage side power supply generation circuit 8 is supplied to the lower-arm side drive circuit power supply circuit 12b via the single-direction switch 42, and thus, it is possible to ensure a power supply path for the lower-arm side drive circuit lib. Therefore, it is possible to reduce the wait time of the start of the inverter not only when an error occurs in the high-voltage power supply 1, but also after the high-voltage power supply is turned on.

Figure 5:
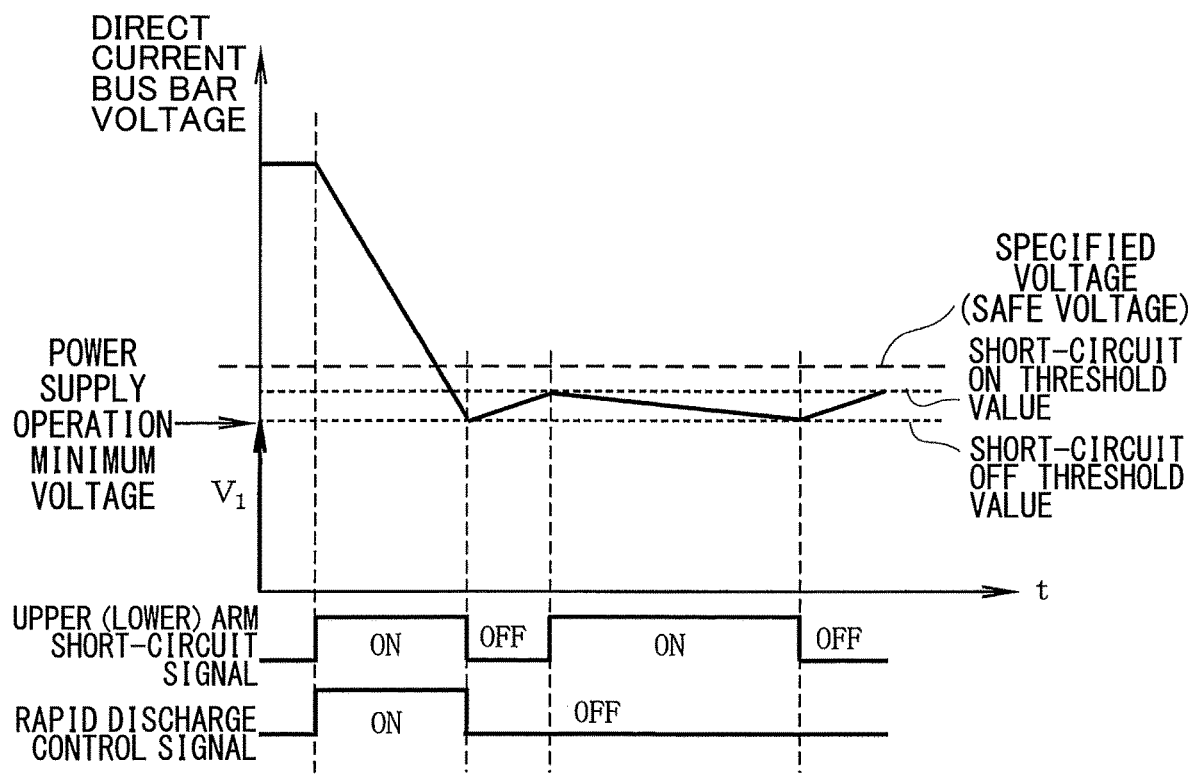
FIG. 5 is a drawing illustrating the direct current bus bar voltage, the value relationship between the threshold values, the upper (lower) arm short-circuit signal, and the rapid discharge control signal according to the second embodiment and the third embodiment of the present invention.
Figure 7:
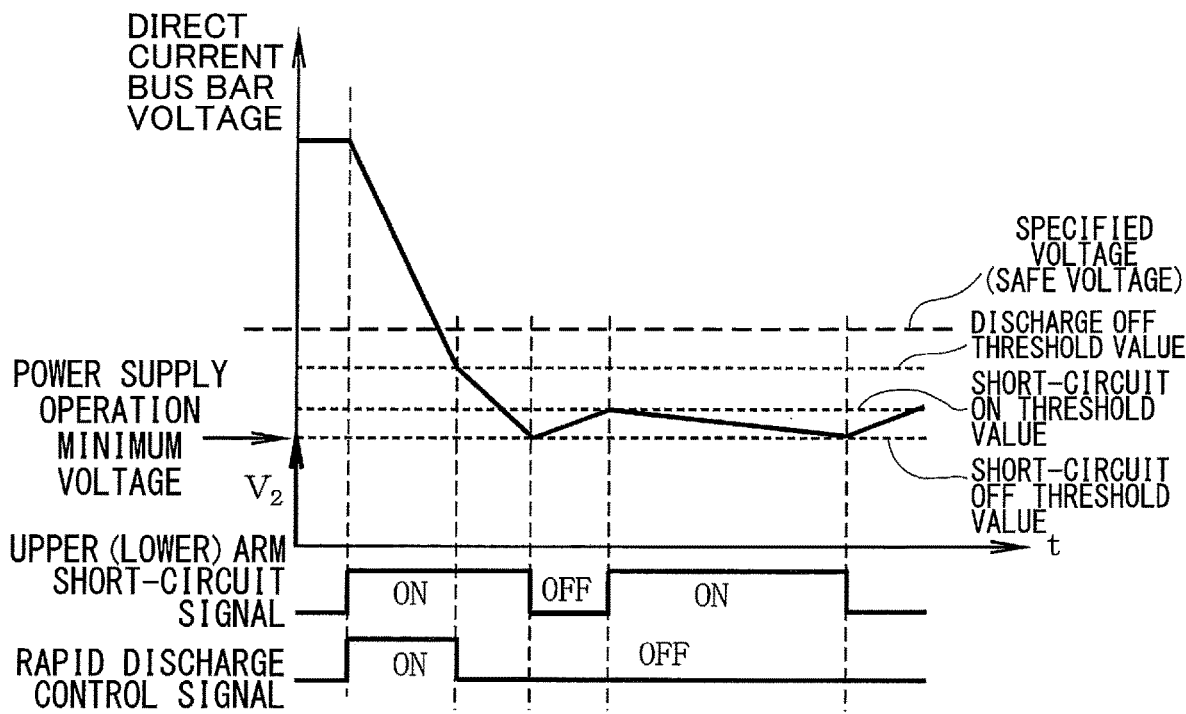
FIG. 7 is a drawing illustrating the direct current bus bar voltage, the value relationship between the threshold values, the upper (lower) arm short-circuit signal, and the rapid discharge control signal according to the conventional technique.
Figure 8:
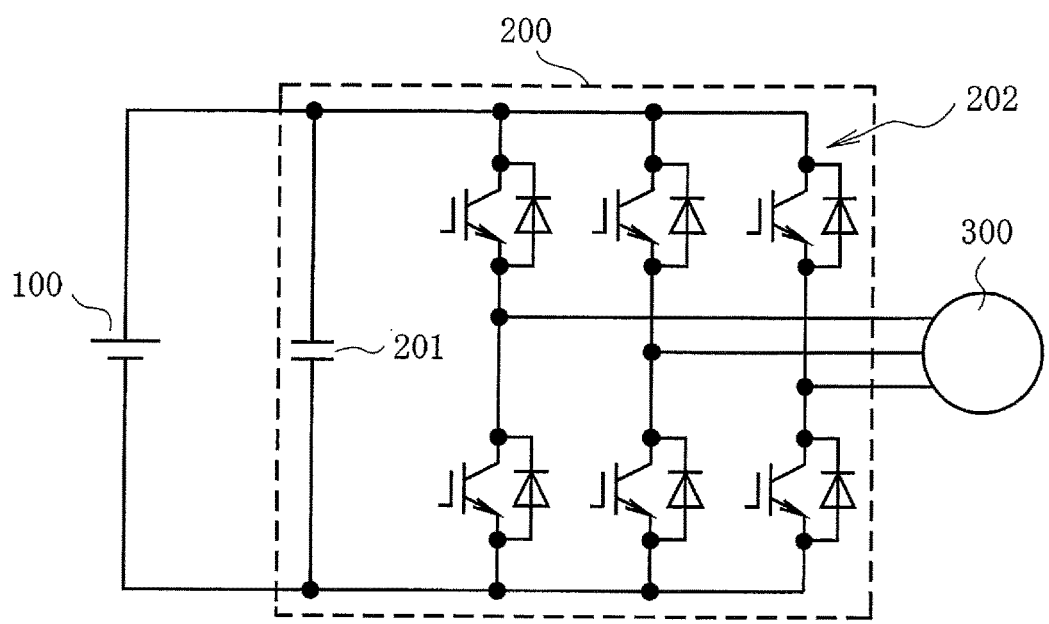
FIG. 8 is a structure diagram of an electric system including an inverter, a rotating electric machine, etc.
Figure 9:
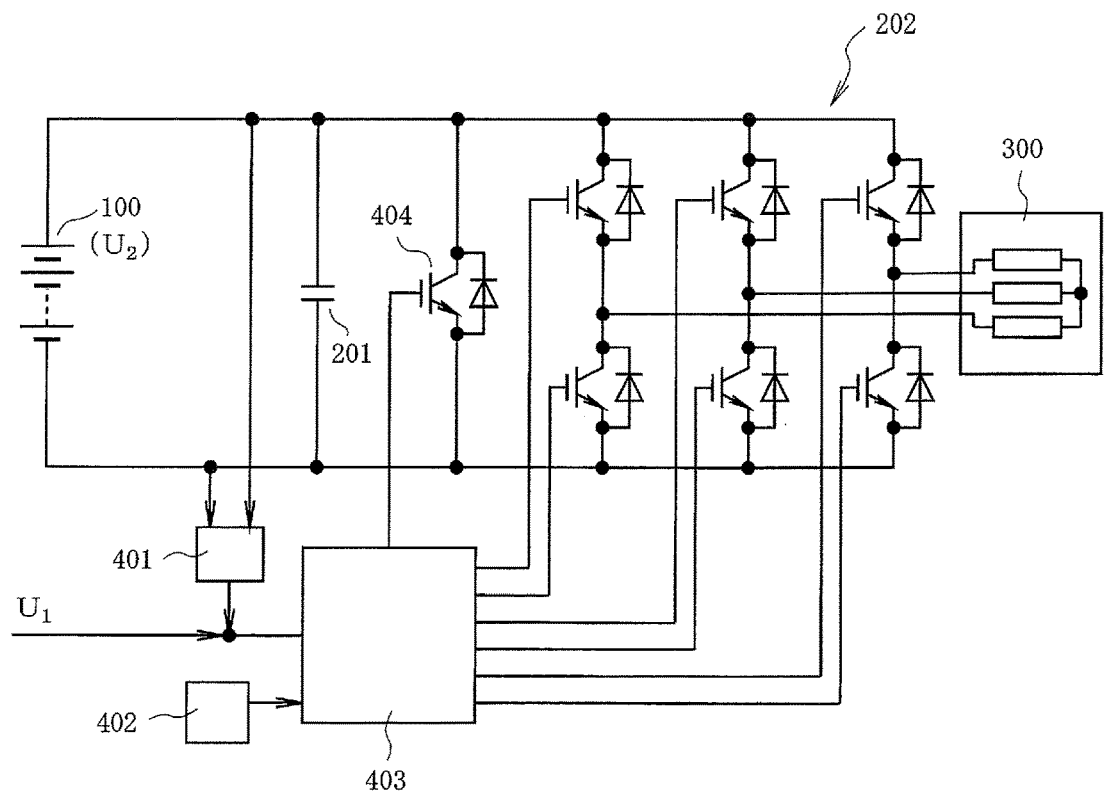
FIG. 9 is a circuit diagram illustrating a conventional technique described in Patent Document 1.
Figure 10:
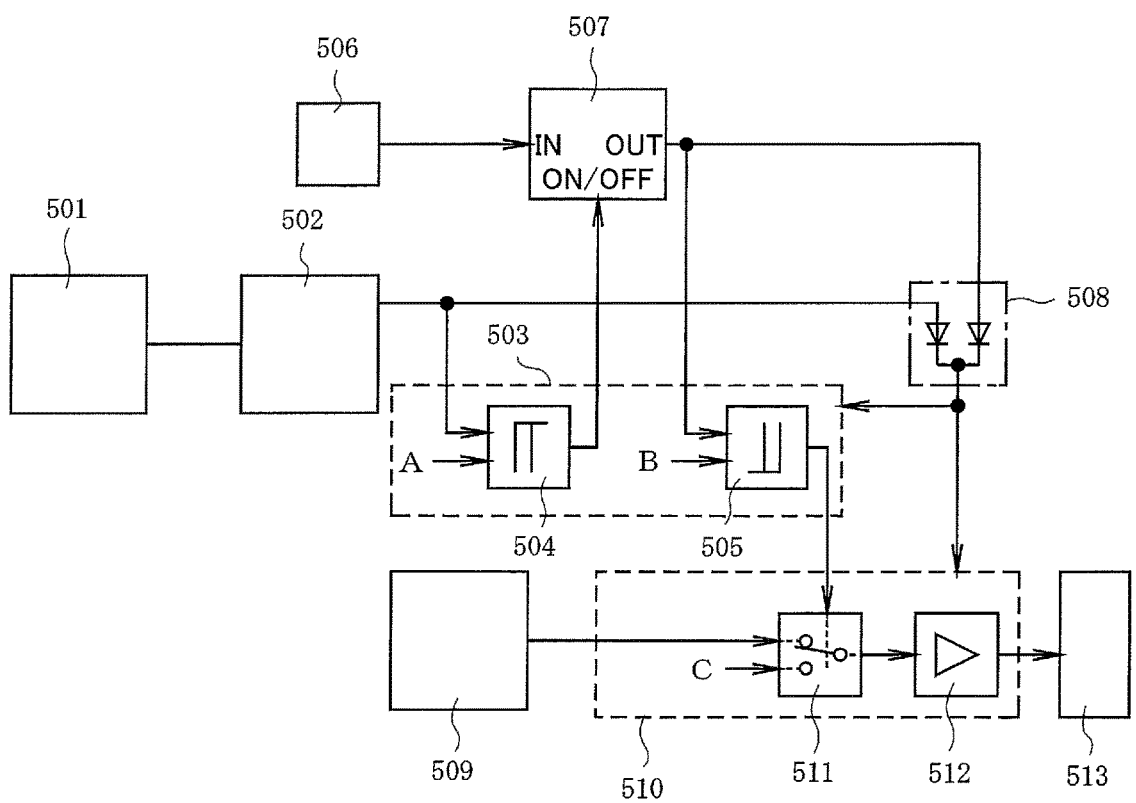
FIG. 10 is a block diagram illustrating one of three phases of an inverter described in Patent Document 2.

Here, FIG. 5 is a drawing illustrating the direct current bus bar voltage, the value relationship between the threshold values, the upper-(lower-) arm short-circuit signal, and the rapid discharge control signal according to the second embodiment and the third embodiment of the present invention. In FIG. 5, the short-circuit ON threshold value corresponds to a first threshold value for turning on the upper-(lower-) arm switching element to perform short-circuiting of the winding of the synchronous motor PM, and the short-circuit OFF threshold value corresponds to a second threshold value for releasing the short-circuiting operation. In these embodiments, it is possible to set the short-circuit OFF threshold value near the specified voltage (safe voltage), and it is possible to set the operable minimum voltage, of the high-voltage side power supply generation circuit 35 that generates power from the direct current bus bar voltage (high-voltage power supply 1), higher than V2 in FIG. 7.

Figure 6:
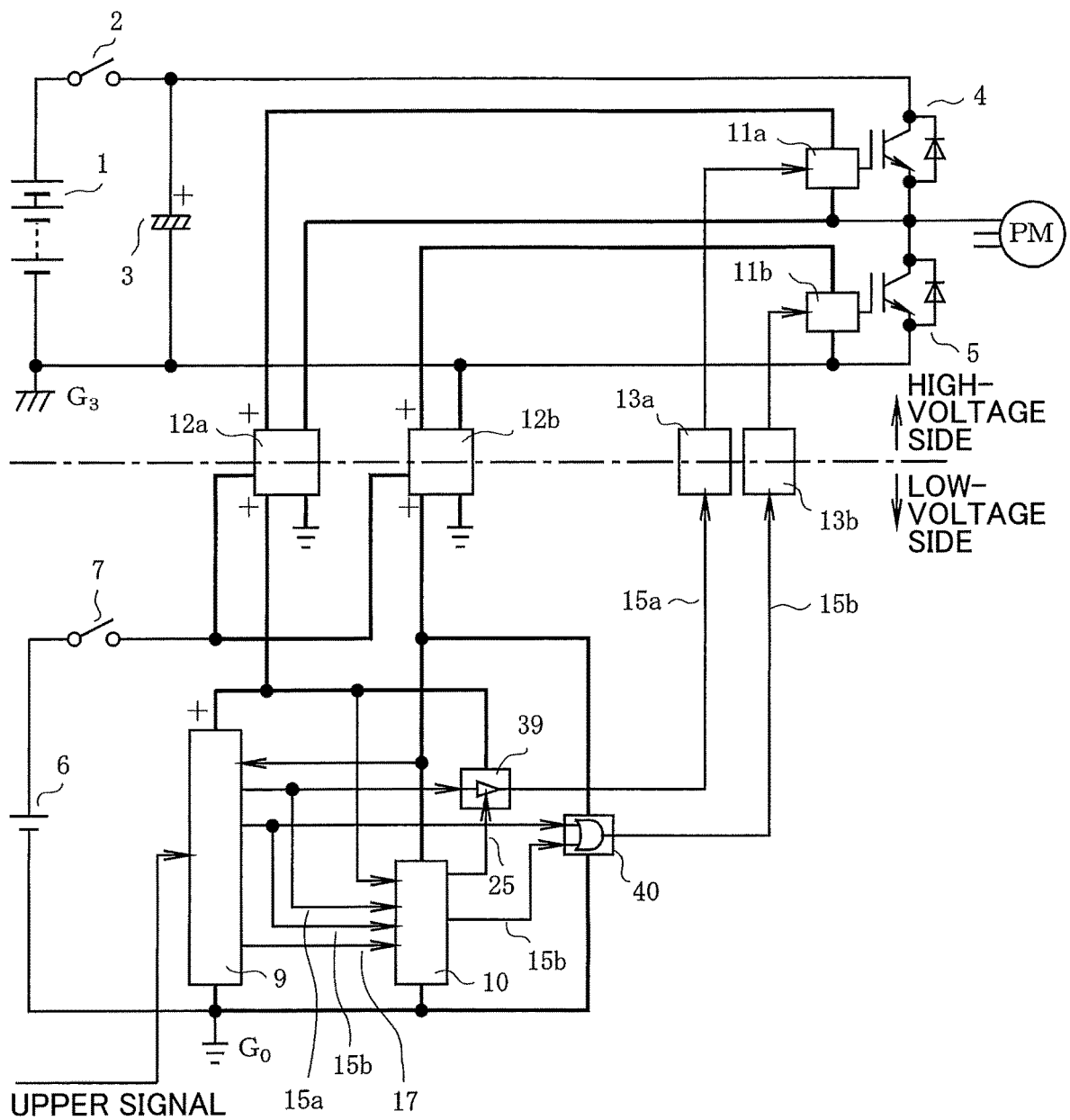
FIG. 6 is a block diagram illustrating a fourth embodiment of the present invention.

Next, a fourth embodiment of the present invention will be described. FIG. 6 is a block diagram illustrating the fourth embodiment. In the fourth embodiment, the configuration is simpler than the configuration of the second or the third embodiment. In the main circuit, the discharge circuit (the switching element 33, the discharge resistance 34 in FIG. 3, FIG. 4), the discharge drive circuit 32, and the voltage detection circuit 31 are removed. Further, in the control device, the high-voltage side power supply generation circuit 35, the control signal transmission circuits 36, 37, the first and second low-voltage side power supply generation circuits 8, 38, etc., are removed.

In FIG. 6, the upper-arm side drive circuit power supply circuit 12a and the lower-arm side drive circuit power supply circuit 12b are connected to the low-voltage power supply 6 via a low-voltage power supply switch 7. A power supply voltage, generated by the upper-arm side drive circuit power supply circuit 12, is supplied to the upper-arm side drive circuit 11a, the first control circuit 9, and the tri-state buffer 39. Further, a signal that detects the power supply voltage is input to the second control circuit 10. A power supply voltage, generated by the lower-arm side drive circuit power supply circuit 12b, is supplied to the lower-arm side drive circuit 11b, the second control circuit 10, and an OR circuit 40. Further, a signal that detects the power supply voltage is input to the first control circuit 9.

In this embodiment of the present invention, as long as the low-voltage power supply 6 is normal, the probability, of occurrence of a simultaneous error in the upper-arm side drive circuit power supply circuit 12a and the lower-arm side drive circuit power supply circuit 12b, is very low, and thus, it is possible to turn on the switching element 4 or the switching element 5 to perform short-circuiting of the winding of the synchronous motor PM according to the operation of the upper-arm side drive circuit 11a or the lower-arm side drive circuit 11b.

INDUSTRIAL APPLICABILITY

It is possible to apply an embodiment of the present invention to various types of power conversion devices including an inverter or a converter in which an upper-arm switching element and a lower-arm switching element are driven by respective separate drive circuits.

REFERENCE SIGNS LIST

1: high-voltage power supply
2: high-voltage power supply switch
3: smoothing capacitor
4, 5: semiconductor switching element
6: low-voltage power supply
7: low-voltage power supply switch
8: low-voltage side power supply generation circuit
8c: control circuit auxiliary power supply
9: first control circuit
10: second control circuit
10a: processing unit
11a: upper-arm side drive circuit
11b: lower-arm side drive circuit
12a: upper-arm side drive circuit power supply circuit
12b: lower-arm side drive circuit power supply circuit
13a, 13b: control signal transmission circuit
14a, 14b: error signal transmission circuit
15a, 15b: control signal
16a, 16b, 17: error detection signal
18, 19: diode
20, 21, 22, 23: voltage detection signal
24: discharge control signal
31: voltage detection circuit
32: discharge drive circuit
33: switching element
34: discharge resistance
35: high-voltage side power supply generation circuit
36, 37: control signal transmission circuit
38: low-voltage side power supply generation circuit
39: tri-state buffer
40: OR circuit
41: voltage monitor circuit
42: single-direction switch
PM: permanent magnet synchronous motor

What is claimed is:

1. A power conversion device comprising:
a first drive circuit that drives a switching element included in an upper-arm for one of three phases;
a second drive circuit that drives a switching element included in a lower-arm for the one phase;
and a first control circuit that generates a control signal for the first drive circuit or the second drive circuit,
wherein the power conversion device further comprises:
a first power supply circuit and a second power supply circuit that supply power to the first drive circuit and the second drive circuit, respectively;
a high-voltage power supply that supplies power to one of the first power supply circuit and the second power supply circuit; and
a low-voltage power supply that supplies power to the other of the first power supply circuit and the second power supply circuit,
wherein the high-voltage power supply and the low-voltage power supply are separated from each other,
wherein power is supplied from both the high-voltage power supply and the low-voltage power supply,
wherein the power conversion device further comprises a second control circuit that transmits a control signal, generated for the first drive circuit or the second drive circuit when an error occurs, to the first drive circuit or the second drive circuit via the control signal transmission circuit, and
wherein the control signal is generated in accordance with which of the first power supply circuit and the second power supply circuit is a circuit in which the error occurs.

2. The power conversion device according to claim 1, further comprising:
an error detection unit that detects an error of a power supply voltage of the first drive circuit or the second drive circuit, and outputs an error detection signal; and
an error signal transmission circuit that transmits the error detection signal to the first control circuit,
wherein the first control circuit transmits the control signal generated according to an error cause based on the error detection signal to the first drive circuit or the second drive circuit via a control signal transmission circuit, and turns on the switching element included in the upper-arm or the lower-arm.

3. The power conversion device according to claim 1,
wherein the first control circuit is enabled to operate according to power generated by a low-voltage side power supply generation circuit having the low-voltage power supply as a power supply source, and outputs, to the second control circuit, an error detection signal generated by detecting an error in a voltage supplied to the low-voltage side power supply generation circuit, in a voltage supplied to the first control circuit, or in the first control circuit itself.

4. The power conversion device according to claim 3,
wherein the second control circuit, to which the error detection signal from the first control circuit is input, in the case where an error in a voltage supplied to the low-voltage side power supply generation circuit is detected based on the error detection signal, generates the control signal that turns on the switching element of the corresponding arm according to the corresponding drive circuit via the first power supply circuit or the second power supply circuit having the high-voltage power supply as a power supply source.

5. The power conversion device according to claim 3,
wherein the second control circuit, to which the error detection signal from the first control circuit is input, in the case where an error other than an error in a voltage supplied to the low-voltage side power supply generation circuit is detected based on the error detection signal, generates the control signal that turns on the switching element of the upper arm or the lower arm according to the corresponding drive circuit via the first power supply circuit or the second power supply circuit.

6. A power conversion device comprising:
a first drive circuit that drives a switching element of one of an upper-arm and a lower-arm for one of three phases;
a second drive circuit that drives a switching element of the other of the upper-arm and the lower-arm;
a first control circuit that generates a control signal for the first drive circuit; and
a second control circuit that generates a control signal for the second drive circuit,
wherein the power conversion device further includes a first power supply that is a power supply source for the first drive circuit and the first control circuit, and a second power supply that is a power supply source for the second drive circuit and the second control circuit,
wherein one of the first power supply and the second power supply is a high-voltage power supply and the other of the first power supply and the second power supply is a low-voltage power supply, and the high-voltage power supply and the low-voltage power supply are separated from each other,
wherein the power conversion device is enabled to perform:
a short-circuiting operation of load by turning on the switching element of the upper-arm or the lower-arm when a direct current bus bar voltage, that is a voltage between the two ends of a serial circuit of the upper-arm and the lower-arm, arrives at a first threshold value;
an operation of releasing the short-circuiting operation when the direct current bus bar voltage arrives at a second threshold value that is less than the first threshold value; and
a discharge operation of causing a smoothing capacitor, that is connected in parallel with the serial circuit, to discharge, and
wherein, when the direct current bus bar voltage arrives at the second threshold according to the short-circuiting operation, the discharge operation is stopped and the stopped state is maintained.

7. The power conversion device according to claim 6, further comprising a switching unit that switches from the first power supply to the second power supply when an output voltage, of a power supply generation circuit that generates a predetermined power supply voltage from the first power supply, becomes less than a predetermined threshold value.

8. The power conversion device according to claim 7,
wherein the first power supply is a high-voltage power supply, and the second power supply is a low-voltage power supply.

9. The power conversion device according to claim 6,
wherein the first control circuit includes a unit that transmits an error detection signal to the second control circuit when an error of the first control circuit is detected, and a unit that detects that the power conversion device or load has become in a predetermined operation state and that performs short-circuiting of the load by driving the switching element of the upper-arm or the lower-arm according to the first drive circuit.

10. The power conversion device according to claim 9, wherein the second control circuit includes a unit that receives the error detection signal transmitted from the first control circuit, and a unit that shuts off the control signal generated by the first control circuit when it is detected that the power conversion device or load has become in a predetermined operation state, and that performs short-circuiting of the load by driving the switching element of the upper-arm or the lower-arm according to the second drive circuit.

11. The power conversion device according to claim 6, wherein the first control circuit includes a unit that determines an error of an output voltage of the power supply generation circuit having the second power supply as a power supply source, and a unit that, in response to determining an error of the output voltage, performs short-circuiting of the load by driving the switching element of the upper-arm or the lower-arm according to the first drive circuit.

12. The power conversion device according to claim 6, wherein the first control circuit and the second control circuit include a unit that detects an error of an output voltage of each of power supply generation circuits supplying power to the control circuits, and a unit that, in response to determining an error of the output voltage, performs short-circuiting of the load by driving the switching element of the upper-arm or the lower arm through the drive circuit to which power is supplied by one of the power supply generation circuits that is different from the other of the power supply generation circuits in which the error is determined.

\* \* \* \* \*